United States Patent
Arimilli et al.

(10) Patent No.: US 6,665,828 B1
(45) Date of Patent: Dec. 16, 2003

(54) GLOBALLY DISTRIBUTED SCAN BLOCKS

(75) Inventors: Ravi Kumar Arimilli, Austin, TX (US); Roger Ned Bailey, Austin, TX (US); Johnny James Leblanc, Austin, TX (US); Timothy M. Skergan, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 470 days.

(21) Appl. No.: 09/664,848

(22) Filed: Sep. 19, 2000

(51) Int. Cl.$^7$ .............................................. G01R 31/28
(52) U.S. Cl. ...................... 714/726; 714/733; 365/201
(58) Field of Search .............................. 714/726, 724, 714/738; 371/22.3, 22.4, 22.1; 235/492; 326/16, 40, 38; 708/230; 365/201

(56) References Cited

U.S. PATENT DOCUMENTS

| | | | |
|---|---|---|---|
| 5,159,183 A | * 10/1992 | Yamaguchi | 235/492 |
| 5,309,447 A | * 5/1994 | Moskowitz et al. | 371/22.4 |
| 5,446,683 A | * 8/1995 | Mullen et al. | 364/717 |
| 5,627,839 A | * 5/1997 | Whetsel | 371/22.3 |
| 5,640,402 A | * 6/1997 | Motika et al. | 371/22.3 |
| 5,642,362 A | * 6/1997 | Savir | 371/22.3 |
| 5,717,700 A | * 2/1998 | Crouch et al. | 371/22.3 |
| 5,742,617 A | * 4/1998 | Warren | 371/22.31 |
| 5,790,561 A | * 8/1998 | Borden et al. | 371/22.1 |
| 5,903,578 A | * 5/1999 | De et al. | 371/22.31 |
| 6,018,815 A | * 1/2000 | Baeg | 714/726 |
| 6,122,762 A | * 9/2000 | Kim | 714/726 |
| 6,510,534 B1 | * 1/2003 | Nadeau-Dostie et al. | 714/724 |

* cited by examiner

*Primary Examiner*—Stephen M. Baker
*Assistant Examiner*—Dipakkumar Gandhi
(74) *Attorney, Agent, or Firm*—Richard F. Frankeny; Winstead Sechrest & Minick P.C.; Mark E. McBurney

(57) ABSTRACT

A method and system for testing an integrated circuit (IC) comprising a plurality of logic units and a plurality of level sensitive scan design latches (LSSD) chains (scan chains) where the partitioning of the scan chains is different than the partitioning of the logic units. Scan blocks, each scan block comprising multiplexers, a pseudo random pattern generator (PRPG), a partitioned multiple input shift register (MISR), functional logic and control function logic are distributively placed around and close to scan inputs and scan outputs of the IC in otherwise unused area too small for larger functional logic blocks. The MISR, which contains many loaded latches and other logic, would normally be the largest element of the scan block has been partitioned into a sub-set of a full MISR to minimize the size of an individual scan block. The scan block has the functionality to enable LSSD testing, system testing and logic built in self test (LBIST) by the way the individual scan blocks are wired to the scan inputs and scan outputs of the logic units within the IC. Two or more scan blocks are needed to make a complete MISR depending on the sub-set partitioning of the MISR in each scan block. Scan block may have particular IC scan inputs and scan outputs wired into many different multiplexer inputs maintaining a known testability so wiring at the local level may be optimized. Since most of the wiring to the logic unit scan chains, wiring to the central scan switch is minimized reducing wiring complexity and cost. By partitioning the MISR, the size of the standardized Scan blocks is minimized allowing the most effective placement around logic units.

30 Claims, 11 Drawing Sheets

GLOBALLY DISTRIBUTED SCAN BLOCKS

TECHNICAL FIELD

The present invention relates in general to integrated circuit (IC) testing and in particular to testing ICs having scan chains using Level Sensitive Scan Design (LSSD).

BACKGROUND INFORMATION

Very Large Scale Integrated (VLSI) circuit devices have used serial scanning of flip-flops or latches for quite some time to set and observe the internal latch logic values for test and diagnostic purposes. Level sensitive scan design (LSSD) is an accepted test method used for manufacturing wafer test, logic built-in self-test, debug, and diagnostic testing. FIG. 6 illustrates a prior art LSSD circuit configuration for LSSD latches. The LSSD latches have two modes of operation; in the first mode, the normal latch function is retained with a latch input, latch clock and latch output, and in the second mode, shift data is set into the latch and the result is shifted out via an output of a shift latch. In this way the normal latch output is used internally and the result of the scan input can be scanned out serially as in a shift register. FIG. 7 is a circuit diagram illustrating a group of LSSD latches 701, 702, and 703 linked together where data is serially scanned into (scan_input 707) and scanned out (scan_output 706). FIG. 8 also illustrates logic blocks 801–804 within a chip linked together with scan chains to allow larger blocks of logic to be tested.

Given the increasing complexities of the VLSI designs, LSSD techniques have become increasingly relied upon to solve time-to-market and manufacturing quality issues. At the same time, the wiring overhead to implement the scan chain connectivity increasingly interferes with achieving the marketable function (what the logic was designed to do) of the IC. The number of individual logic units and therefore the number of scan chains necessary to test the logic of the units has dramatically increased.

To facilitate the various testing modes that are possible with LSSD techniques, designs have used scan switches which are units that couple data from external sources to scan chains in different logic units within a VLSI chip. A source of LSSD data external to a chip must be coupled and directed to the various logic units that are to be tested inside the VLSI chip. While it is possible to construct large scan chains of LSSD latches for a logic unit, this connectivity is not efficient from a test time and test cost perspective. LSSD latches within a logic unit may be partitioned into smaller scan chains so data can be inputted to the scan chains in parallel for certain tests. If it is necessary to exercise a larger portion of the logic in a logic unit, then scan chains may be concatenated to facilitate this system level testing. A scan switch with connectivity to the various inputs and outputs of scan chains within logic units incorporates the functionality of scan chain concatenation. Because the data patterns necessary for the scan chains are complex, various linear feedback shift registers have been constructed for data generation within a scan switch. These data generators may cycle through large numbers of test cases which must be analyzed for logic faults. For this reason, methods using Multiple Input Shift Registers (MISR) are also employed in scan switches to enable signature analysis to increase test coverage and reduce test time.

LSSD methods have been key to enabling complex VLSI chips to be tested economically. However, coupling the many required scan chains has lead to heavy wiring congestion in the wiring channels normally reserved for creating the marketable logic functions of a chip. Therefore there is a need for a method to enable the various LSSD test modes required for VLSI chips while reducing the wiring complexity necessary to implement the test modes from a central scan switch.

SUMMARY OF THE INVENTION

Embodiments of the present invention partition the functionality of a single central scan switch into small globally distributed scan blocks to alleviate the unacceptable massive global wiring congestion created by the prior art designs. The small globally distributed scan blocks are designed with the functionality to generate scan data, provide concatenation of local scan chains, and generate signature patterns while requiring a minimum of control signals from a central location. To keep each scan block a minimum size, the logic circuitry necessary to generate the large test patterns and resulting signature patterns for logic built in self-test (LBIST) has also been partitioned so multiple scan blocks are necessary to generate a complete LBIST unit. A pseudo random pattern generator (PRPG) and a multiple input shift register (MISR) have been partitioned to minimize the size of the scan blocks. The scan blocks, therefore, may be placed in areas around logic units which may be too small for functional logic. Multiple scan blocks are wired to various logic units to allow concatenation of scan chains for LBIST, level sensitive scan design (LSSD) test and SYSTEM test. A number of scan blocks are also wired to generate a complete MISR and PRPG for the IC.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
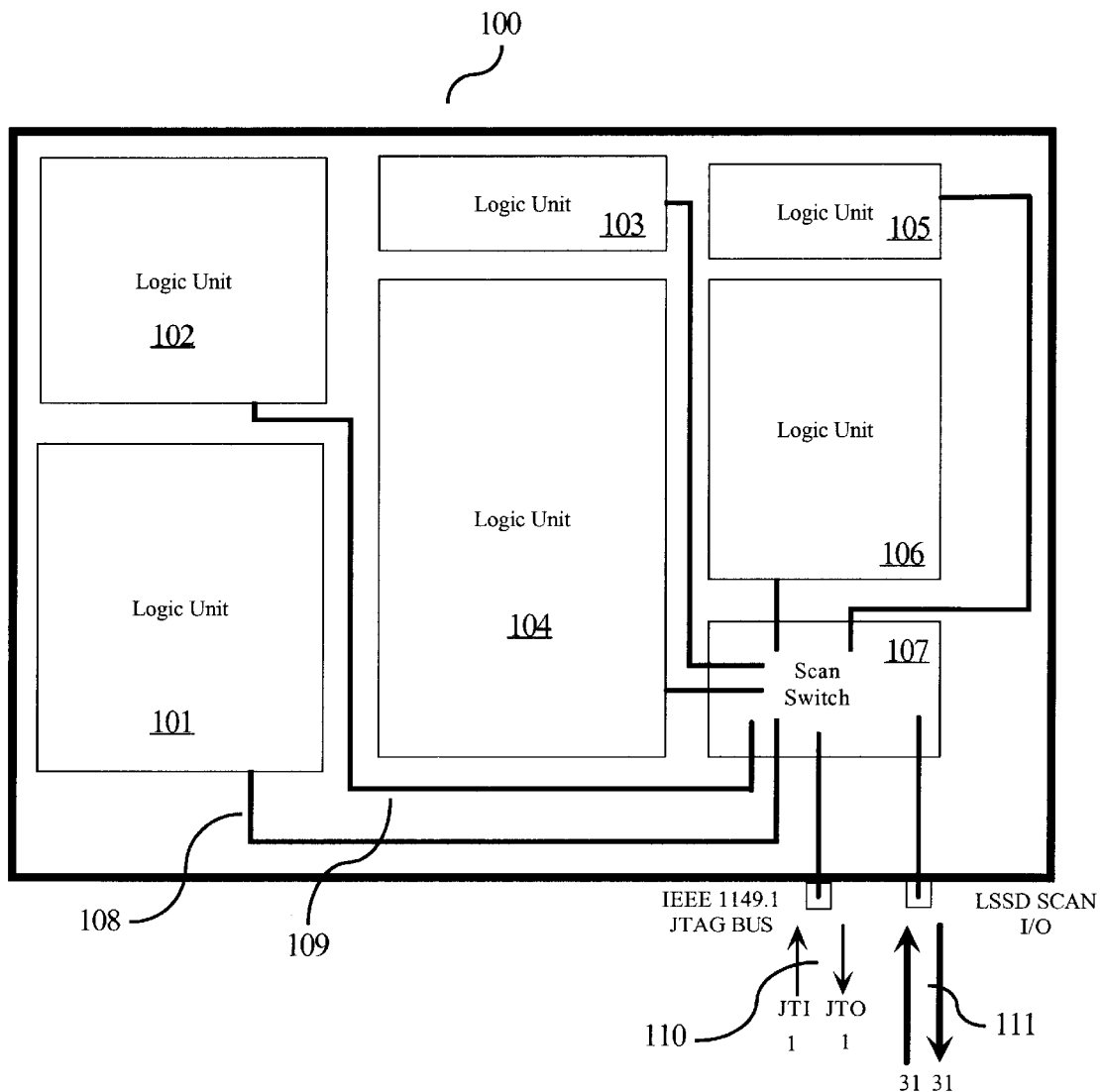
FIG. 1 is a connection of a prior art central scan switch to a number of logic units.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like may have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 6:
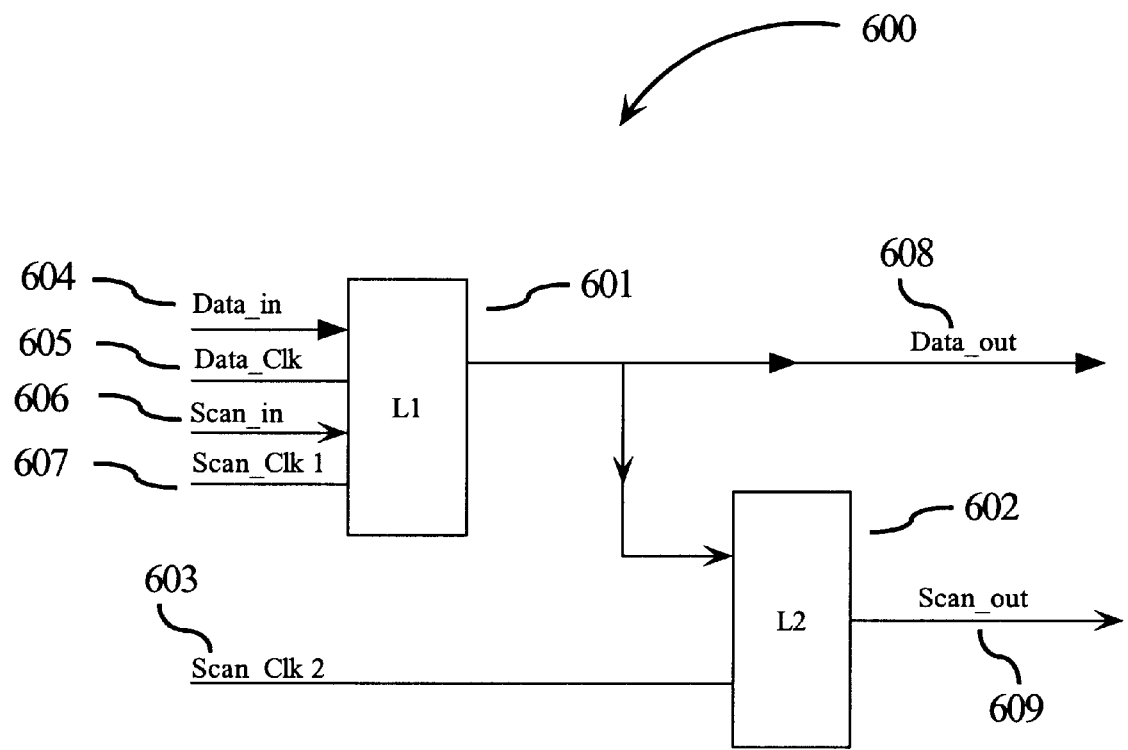
FIG. 6 illustrates a prior art level sensitive scan design (LSSD) latch.

FIG. 6 is an illustration of a prior art data latch 601 converted to a scan latch 600 by adding latch L2 and inputs Scan_in 606, Scan_Clk 1 607 and Scan_Clk 2 603. If Scan_Clk 1 607 and Scan_Clk 2 603 are turned off, then latch L2 602 is disabled and the data latch 601 is controlled by Data_in 604 and Data_Clk 605. When Scan_Clk 1 607 and Scan_Clk 2 603 are used, data from Scan_in 606 may be latched (scanned) into data latch L1 601 and then shifted into latch L2 602 with Scan_Clk 2 603. In a normal data mode (the scan clocks are inactive), Data_out 608 would output data, previously latched in from Data_in 604, using Data_Clk 605. During the scan mode, data is scanned in from Scan_in 606, stored in latch L1 601 and then shifted to latch L2 602 and outputted via Scan_out 609.

Figure 7:
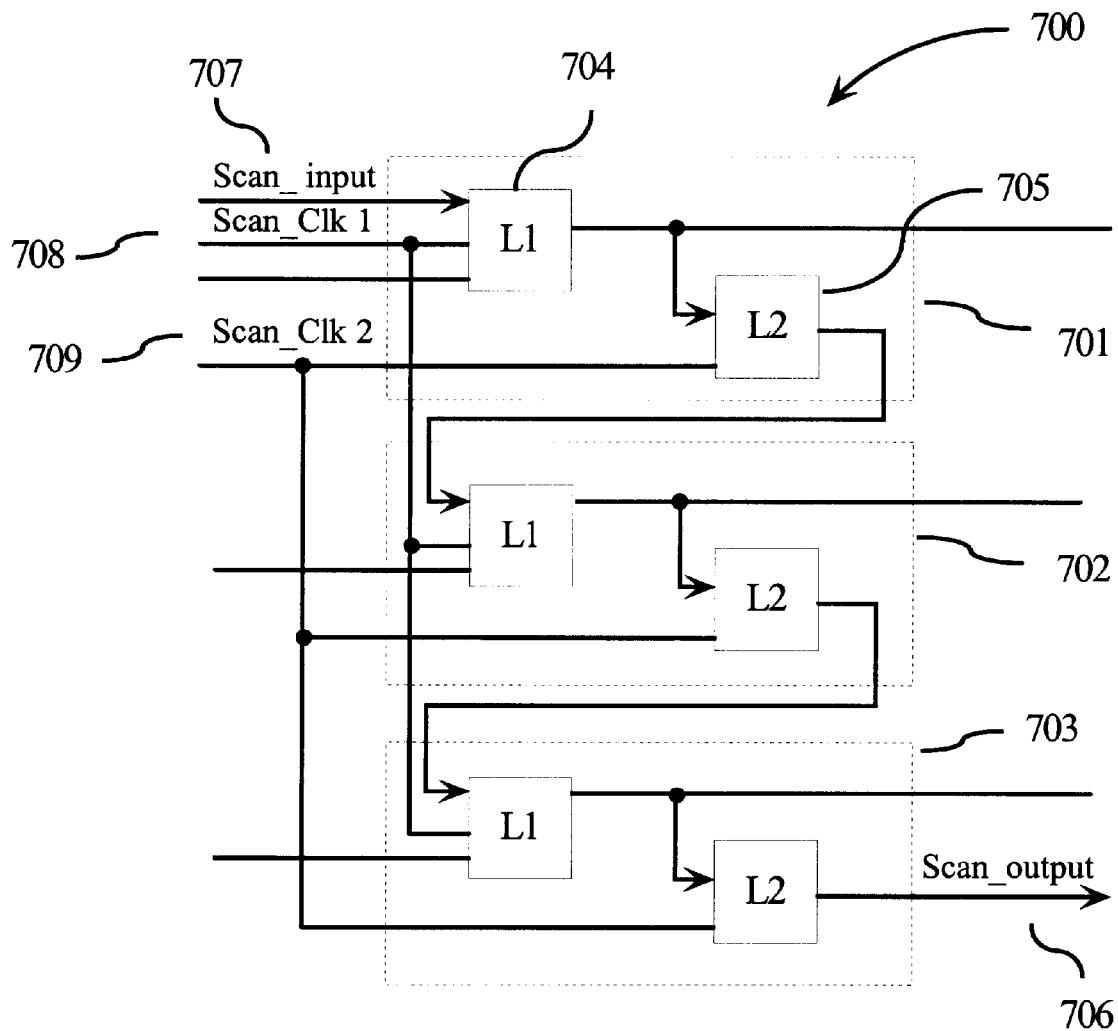
FIG. 7 illustrates a prior art group of LSSD latches connected to form a scan chain.

FIG. 7 illustrates how a number of scan latches are coupled to create a scan chain 700. Data latch 704 and latch 705 combine to form Scan latch 701. Scan latches 702 and 703 are formed in a similar manner. If Scan latches 701–703 are used as a three bit parallel data structure, then data may be serially scanned into the L1 latches (e.g., 704) of LSSD latches 701–703 using the Scan_input 707 and Scan_Clk 1 708 and Scan_Clk 2 709. Once data has been scanned into the latches, a data clock (e.g., 605 in FIG. 6) is used to apply the parallel data to a logic function (not shown). The input data stream may then be scanned out (Scan_output 706). The resulting outputs of the logic function may by coupled back to the data inputs with appropriate logic so the results of the parallel operation may be stored in the same latch that applied the inputs. In this manner a single scan chain may be used to scan in data and scan out results.

Figure 8:
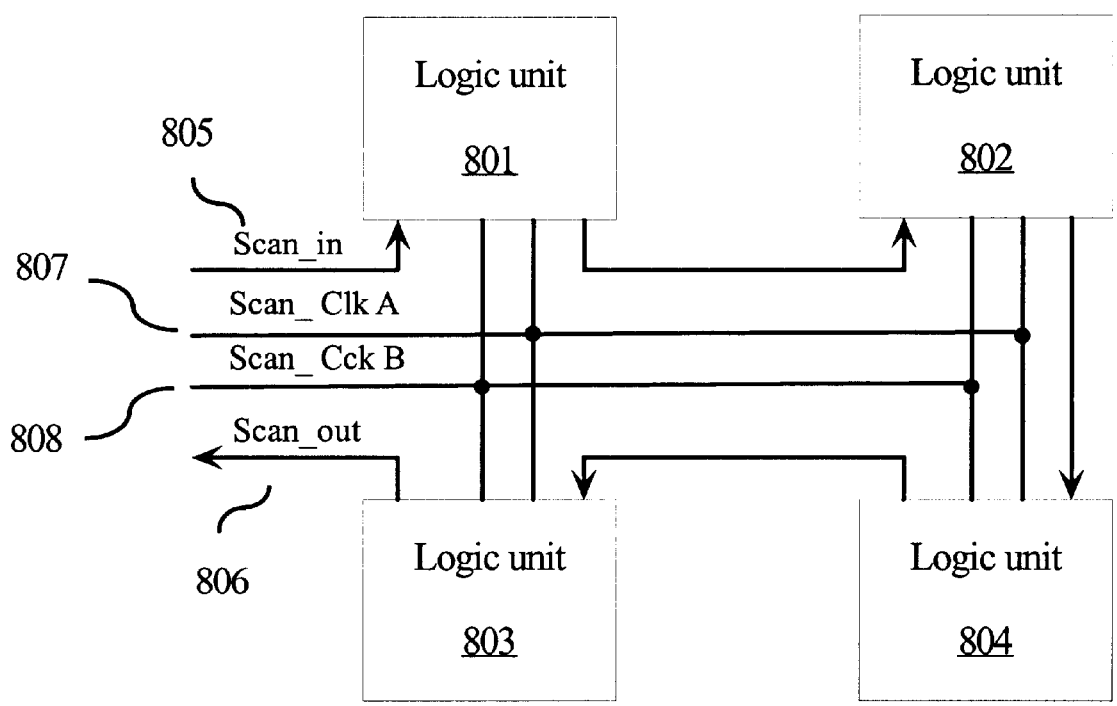
FIG. 8 illustrates prior art scan chains of four logic units concatenated into one scan chain.

FIG. 8 illustrates scan chains of a number of logic units 801–804 concatenated to make a single scan (the chains internal to logic units 801–804 are not shown) chain operating with corresponding Scan_Clk A 807 and Scan_Clk B 808. The input to the concatenated scan chains is Scan_in 805 and the output is Scan_out 806. In the example illustrated in FIG. 8, the wiring efficiency for testing Logic Units 801–804 is maximized (one input and one output wire) but the speed at which data may be loaded via Scan_in 805 is minimized (all scan chains are loaded serially).

FIG. 1 is a block diagram of a prior art IC 100 with individual logic units 101, 102, 103, 104, 105, and 106. A central scan switch 107 interfaces multiple inputs 110 and 111. The scan switch 107 provides I/O lines (e.g., 108 and 109 to logic unit 101 and 102 respectively) to each logic unit. These I/O lines couple with scan_inputs and scan_outputs of scan chains (see FIGS. 6, 7 and 8) in each Logic Unit 101–107. Data sequences (not shown) are sent to various scan_inputs and the results of exercising particular logic is returned to the scan switch via scan_outputs. For a logic built in self-test (LBIST), the results of an operation executed on long sequential data patterns may be compressed in the scan switch 107 to generate a signature pattern to simplify the amount of data necessary for test analysis. Because the logic units in ICs have become very complex, many separate scan chains are required in each logic unit to obtain complete coverage and to speed up test time. These many individual scan chains lead to global wiring complexity which uses up wiring tracks necessary for marketable logic functions. Because large numbers of logic gates are realizable in present ICs, embodiments of the present invention fabricate a small generic scan block which is replicated and placed in unused areas around the logic units. These scan blocks, which replicate much of the functionality of the prior art central scan switches, may be placed close to scan chain inputs and outputs in the logic units. The globally placed scan blocks reduce the global wiring complexity of prior art designs. The scan blocks shift the wiring from global wiring to local wiring which is easier to realize thereby reducing the wires in global wiring channels used by marketable logic functions. Using the small generic scan blocks also frees chip designers from the constraints in placement of scan chain inputs and outputs in the logic units. Previously, chip designers had to try to place scan chain inputs and outputs with the global wiring requirements in mind. Embodiments of the present invention allow the marketable logic to be optimized and then the generic scan blocks may be placed in unused areas after floor planning of the IC.

Figure 9:
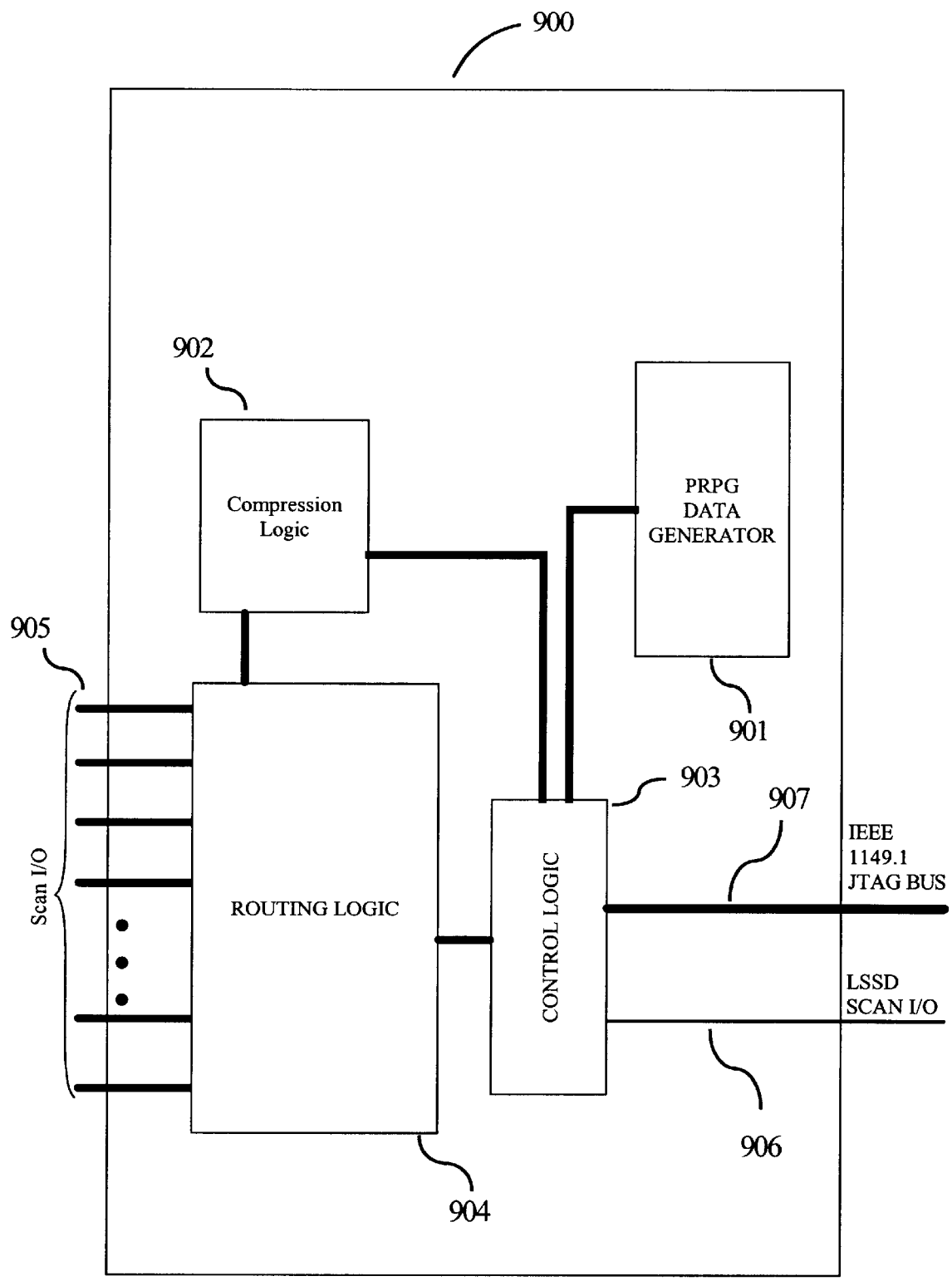
FIG. 9 illustrates the functional blocks in a prior art central scan switch.

FIG. 9 is a block diagram illustrating the functionality of a prior art central scan switch 900. Routing logic 904 determines the connections to Scan I/O 905. Scan I/O 905 represents all the input and output Scan chain connections in the various logic units (not shown). Depending on the number of logic units and the required number of scan chains, the Scan I/O 905 lines may be quite large which may in turn create global wiring problems. Compression logic 902 is used to compress data received from scan_outputs in Scan I/O 905 and send the compressed data as a signature to the buses 907 and 906. The Psuedo Random Pattern Generator (PRPG) 901 is used to generate psuedo random data patterns within the switch to reduce the external data required from buses 906 and 907. Test requests may be sent to the control logic 903 to set up the mode of testing. Scan chain concatenation along with specific data patterns result from control data sent to control logic 903 and PRPG 901. The amount of global wiring required by the many logic units and scan chains required for modern processors and ICs has created a major problem for a central scan switch like Scan switch 900.

Figure 2:
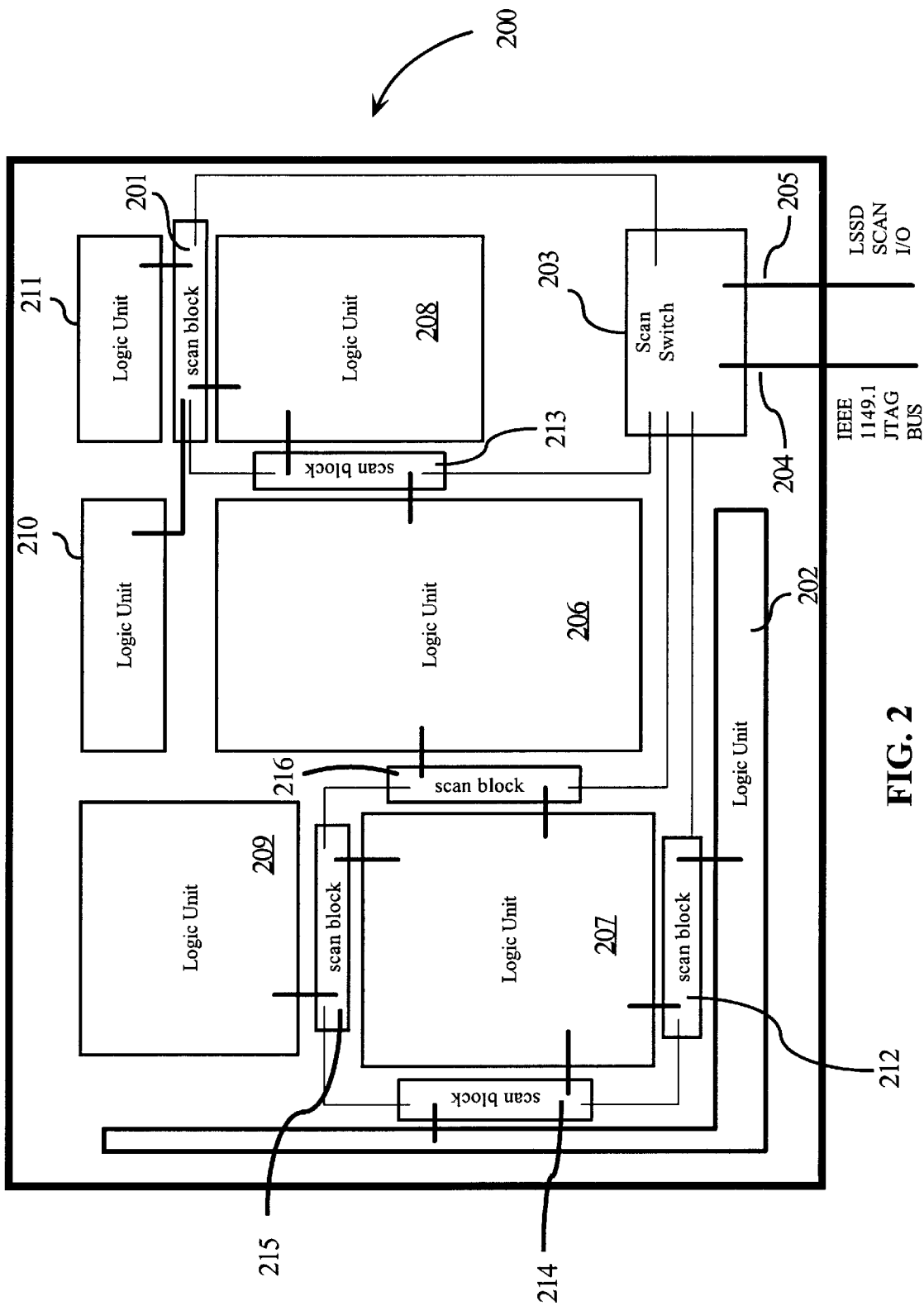
FIG. 2 illustrates embodiments of the present invention where distributed scan blocks are placed around logic units.

FIG. 2 is a block diagram illustrating embodiments of the present invention where portions of Scan switch 900, illustrated in FIG. 9, are partitioned into generic scan blocks (e.g., 201 and 212–216). Scan switch 203 replaces Scan switch 900 with a scan switch having a reduced functionality and reduced global wiring requirement. The Scan blocks (e.g., scan blocks 201 and 212–216) are placed around the logic units 206–211 of an IC 200 in close proximity to the Scan chains (not shown) within the logic unit(s) they serve. For example Scan block 201 is close to logic units 208, 210 and 211. Some logic units (e.g., 206 and 207 are served by multiple Scan blocks (213, 216 and, 212, 214, 215 and 216 respectively). The Scan blocks (e.g., 201 and 212–216) are small generic units that are replicated and placed in unused area between logic units, therefore, trade offs can be made between wiring complexity and adding additional scan blocks. Central scan switch 203 need only couple control information and a smaller number of inputs and outputs to the individual scan blocks (e.g., 201 and 212–216). The individual scan blocks (201 and 212–216) have the functionality to generate data patterns, concatenate scan chains, and compress resulting output data.

Central scan switch 203 provides access to an external tester (not shown) via the buses 204 and 205.

Figure 3:
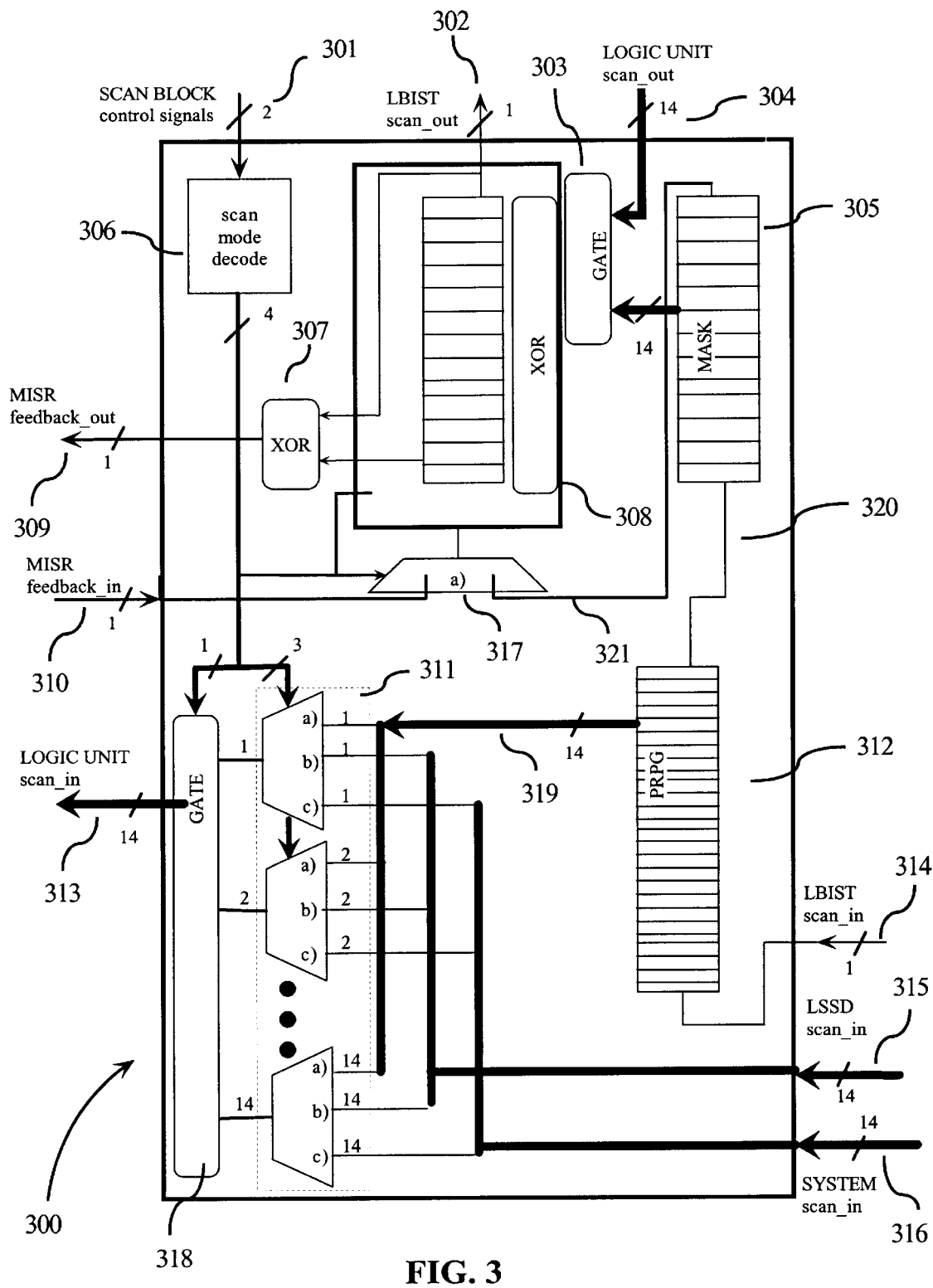
FIG. 3 is a block diagram of a scan block used in embodiments of the present invention.

FIG. 3 is a detailed diagram illustrating the functionality and the logic incorporated in the scan blocks (e.g., 201, and 212–216) used in embodiments of the present invention. In FIG. 3, a central scan switch (e.g., scan switch 203) generates scan block control signals 301. In FIG. 3, scan block control signals 301 comprise two lines which are decoded in scan mode decode 306 into four controls signals which are coupled to a multiplexer unit 311, gates 318 and multiplexer 317. Multiple multiplexer (3:1) are grouped to form a three way fourteen fold multiplexer unit 311. This means that three input signal groups (PRPG 319, LSSD scan_in 315, and SYSTEM scan_in 316) comprising fourteen signals each are multiplexed into one group of fourteen output signals (LOGIC UNIT scan_in 313). PRPG 312 is a shift register with feedback (not shown) having an LBIST scan_ in 314 input and an output 320 of PRPG 312 that feeds into a MASK logic circuit 305. MASK logic circuit 305 comprises a shift register with fourteen parallel outputs feeding gate 303. MASK 305 is used to mask LOGIC UNIT scan_out 304 signals not part of a particular test. There is no requirement that all the LOGIC UNIT scan_out 304 signals come from the same logic unit. MASK 305 also couples to multiplexer 317 which is in turn coupled to a multiple input shift register (MISR) 308. The serial input 320 to MASK 305 allows it to be loaded serially via a scan chain. MISR feedback_out 309 is a signal used in link MISR circuits (e.g., 308) together. In one embodiment of the present invention MISR feedback_out 309 from a first scan block (not shown) would be coupled to MISR feedback_in 310 of another second scan block (not shown). When PRPG 312 is seeded (initial pattern) and SCAN SWITCH control 301 gates multiplexer unit 311 so inputs from PRPG 312 couple into LOGIC UNIT scan_in inputs 313, feedback of LOGIC UNIT scan_out 304 signals are produced as PRPG 312 cycles through its pseudo random pattern (eventually returns to a known result). MISR 308 should end in a known signature state which can be read out on LBIST scan_out 302 to an exemplary central scan switch 203. Multiplexer 317 switches the input of MISR 308 so signals can be scanned out via PRPG 312, MASK 305 and MISR 308. In embodiments of the present invention the LBIST path (e.g., LBIST scan_in 314 through to LBIST scan_out 302) may be concatenated in multiple scan blocks (e.g., scan block 300) to create another scan chain for scanning in or out data for PRPG 312 and MISR 308.

LSSD scan_in 315 comprises selected signals from a central scan switch (e.g., scan Switch 203) and selected LOGIC UNIT scan_out (e.g., 304) signals from Logic Units (e.g., 206–209). Typically a central scan switch (e.g., scan switch 203) has a limited number of inputs and outputs. In embodiments of the present invention an exemplary scan switch 203 has 32 inputs and 32 outputs. If an IC (not shown) under test has many scan chains, then scan blocks, like exemplary scan block 300 are used to concatenate the scan chains so that the total number of scan chain inputs and outputs from the multiple logic units in the IC are within the capability of the central scan switch 203. The LSSD mode (set by scan block control signals 301) allows data to be entered into scan chains in a more parallel mode since fewer scan chains are concatenated in the LSSD mode than with the SYSTEM mode.

SYSTEM scan_in 316 also comprises signals from a central scan switch 203 and selected LOGIC UNIT scan_ out 304. The selected LOGIC UNIT scan_out 304 signals may be different from the ones used in LSSD scan_in 315 and those used in SYSTEM scan_in 316. In the SYSTEM mode, a large amount of logic (e.g., a system level function) is exercised on a given test cycle. To accomplish this, more LOGIC UNIT scan chains are concatenated together to make the scan chains for the SYSTEM mode. Gates 318 are used to set all the signals in LOGIC UNIT scan_in 313 to a reset state under control of Scan block control signals 301.

Embodiments of the present invention only use a sub-set of a complete MISR (complete means number of bits required in the signature pattern) when designing a Scan block 300 for a particular IC. There are many latches and gates (not shown) in a MISR 308 and they are typically heavily loaded (capacitive circuit loads) so the field effect transistor (FET) devices (not shown) used in the logic gates may be large thus making the MISR 308 the largest circuit element in the Scan block 300. Since this would affect the size of a generic MISR (e.g., MISR 308), embodiments of the present invention break the MISR up into a sub-set of a complete MISR. Since multiple Scan Blocks 300 are used in an IC to get the necessary test coverage, multiple sub-set MISR are present and selected ones may be coupled to make a complete MISR.

Figure 4:
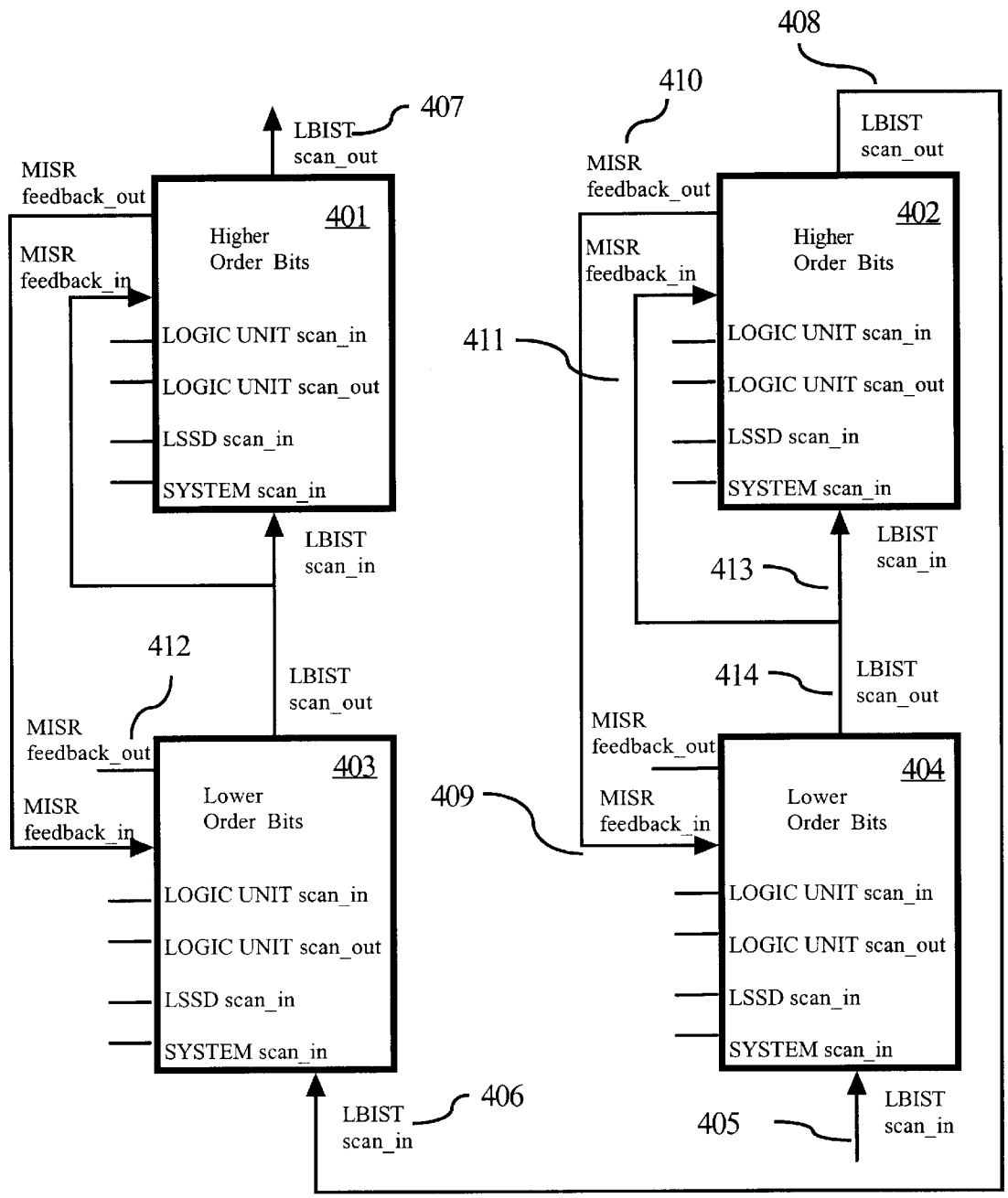
FIG. 4 illustrates a connection of sub-set MISR circuits to form one complete MISR used in embodiments of the present invention.

FIG. 4 illustrates a connection of inputs and outputs of multiple scan blocks 401–404 to create two larger complete MISR (only MISR connections shown). In FIG. 4 only the MISR feedback (input and output) and LBIST scan_in and LBIST scan_out connections are shown for simplicity. The other inputs and outputs (e.g., LOGIC UNIT scan in) of the Scan Blocks 401-404 would be used to complete the test modes as explained above for FIG. 3. In FIG. 4, four scan blocks each with one half of a complete MISR are concatenated to make two complete MISR (e.g., 401 and 403 make a complete MISR). LBIST scan_in 405 is the input to the MISR within scan blocks 401–404 and LBIST scan_out 407 is the output. LBIST scan_out 414 connects to LBIST scan_in 413 and MISR feedback_in 411. MISR feedback_ out 410 of scan block 402 connects back to MISR feedback_in 409 of scan block 404. Some MISR connections (e.g., MISR feedback_out 412) are not connected in this configuration. LBIST scan_out 408, of concatenated MISR in scan blocks 402 and 404, is connected back to the input of concatenated MISR in scan blocks 403 and 401 to make the two complete MISR. A complete MISR has to have an appropriate number of bits to make a polynomial long enough to guarantee an acceptable level of test coverage. As stated before, only a half MISR is included in each scan block (e.g., 401 and 402) to keep the scan blocks small so they can be placed within areas around logic units. MISR are concatenated together using LBIST scan_in signals (e.g., 413) and LBIST scan_out signals (e.g., 414) so the MISR may be loaded from a PRPG 312 using a LBIST scan_in signal 314 and the results from a test iteration may be scanned out using a LBIST scan_out signal 302. Many MISR may be concatenated into a scan chain for loading via a PRPG 312 and the individual MISR feedback_in 411 and feedback_out signals 410 are coupled to create complete MISR and to enable unique signatures to be generated as a PRPG 312 loops through an iteration of data pattern generation.

Figure 5:
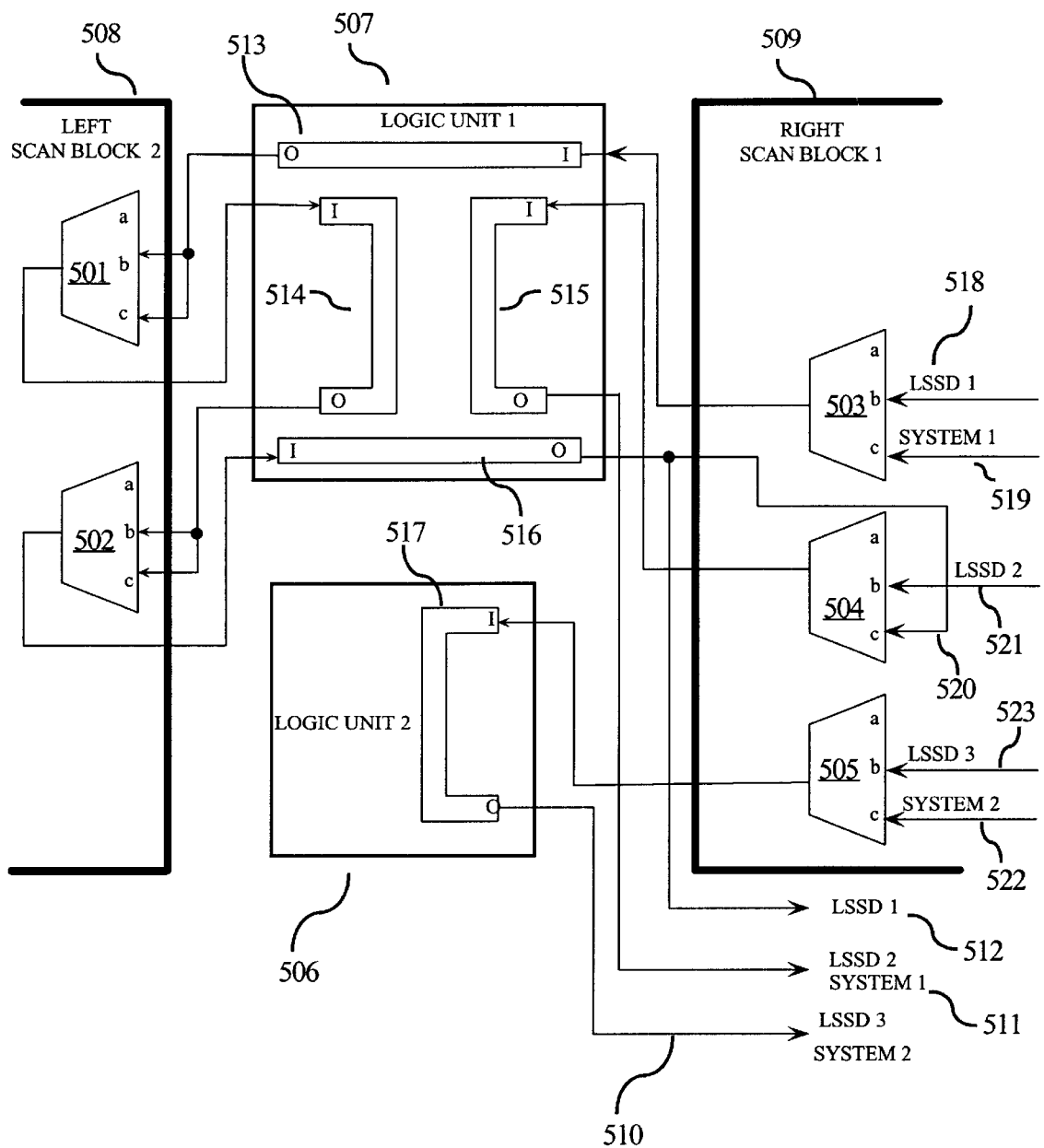
FIG. 5 illustrates connections of scan chains in two logic units using two scan blocks according to embodiments of the present invention.

FIG. 5 is a block diagram illustrating how elements of scan blocks used in embodiments of the present invention are coupled to multiple Logic Units 507 and 506. In this illustration two logic units, Logic Unit 507 and Logic Unit 506 are shown positioned next to each other (not to scale). Logic Unit 507 comprises four scan chains 513–516. Each scan chain is shown to have an input (I) and an output (O). Scan chains may comprise many registers in a shift register configuration and the input to a particular scan chain (e.g., 513) may wire to the right side of Logic Unit 507 while the output is wired to the left side of Logic Unit 507. Similarly scan chains 514, 515, and 517 (in Logic Unit 506) may also have preferential wiring direction for inputs and outputs within their respective logic unit. Because embodiments of the present invention use small distributed scan blocks (e.g., 508 and 509), scan block 508 may be placed on the left side of Logic Unit 507 and 506 while scan block 509 is placed on the right side. In creating concatenated scan chains required for various testing, both scan blocks (e.g., 508 and 509) may be used for a logic unit (e.g., Logic Unit 507) to facilitate the concatenation of scan chains (e.g., 513–516). The illustration of FIG. 5 has an exemplary requirement to create three scan chains for LSSD testing (example for illustration). These scan chains are to have parallel inputs LSSD 1 518, LSSD 2 521 and LSSD 3 523. Multiplexers 501 and 502 in scan block 508 and multiplexers 503–505 in scan block 509 represent part of an N-way K-fold multiplexer unit (e.g., multiplexer unit 311) and are used to concatenate the scan chains (513–517) for the different test modes. FIG. 3 illustrated and explained the operation of the multiplexer unit 311 in a scan block (e.g., 508 and 509) as N-way K-fold units. The concatenation comprising scan chains 513, 514 and 516, for the LSSD test mode, has data inputted to LSSD 1_input 518 and outputted on LSSD 1_output 512. LSSD 2_input 521 couples only to scan chain 515 and LSSD 3 input 523 couples only to scan chain 517 (in Logic Unit 506). From the discussion of FIG. 3, individual multiplexers (e.g. 503) are three way (a, b, c) where "a" is for LBIST, "b" is for LSSD and "c" is for SYSTEM inputs. Since only LSSD and SYSTEM inputs are used in the illustration of FIG. 5, the "a" inputs to the multiplexers (501–505) show no inputs.

In FIG. 5, when the scan block is in the LSSD mode, LSSD input 1 518 couples to multiplexer (MUX) 503 and the output of MUX 503 is coupled to the input (Logic Scan_in) of scan chain 513. The output (Logic Scan_out) of scan chain 513 is coupled to both the LSSD ("b") and the SYSTEM ("c") of MUX 501. The output of MUX 501 is coupled to the input (Logic scan_in of scan chain 514). In either the LSSD or the SYSTEM test mode, MUX 501 will concatenate scan chains 513 and 514. The output (Logic scan_out) of scan chain 514 also couples to both the and "c" input of MUX 502. The output of MUX 502 (Logic scan_ in) is coupled to another scan chain 516 in Logic Unit 507. The output (Logic scan_out) of scan chain 516 couples both to input "c" 520 of MUX 504 and also goes back to a central scan switch (not shown) as LSSD 1_output 512. In the LSSD mode, MUX 503, 501 and 502, concatenate scan chains 513, 514, and 516. Since SYSTEM 1_input 519 is coupled to MUX 503, data on SYSTEM 1_input 519 will be coupled to the input of scan chain 513 in the SYSTEM test mode. Since the output of scan chains 513 and 514 also couple to the SYSTEM input ("c") of MUX 501 and 502, scan chains 513, 514, and 516 are concatenated in the SYSTEM test mode. However, MUX 504 also receives the output of scan chain 516 as its SYSTEM ("c") input 520. The output of MUX 504 is coupled to the input (Logic scan_in) of scan chain 515 and the output (Logic scan_out) of scan chain 515 also goes back to a central scan switch (not shown) as SYSTEM 1_output 511. Therefore in the SYSTEM test mode, all four scan chains 513–516 are concatenated with SYSTEM 1_input 519 and SYSTEM 1_output 511. Also in the SYSTEM test mode, MUX 505 connects SYSTEM 2_input 522 to the input of scan chain 517 and the output of scan chain 517 goes back to a central scan switch (not shown) as SYSTEM 2_output 510. In the LSSD test mode, scan chains 513, 514, and 516 are concatenated with LSSD 1_input 518 and LSSD 1_output 512 using MUXes 501–503. In the LSSD test mode, scan chains 515 and 517 are coupled to LSSD 2_input 521 and LSSD 3_input 523 respectively. The outputs of scan chains 515 and 517 also are LSSD 2_output 511 and LSSD 3_output 510 in the LSSD test mode. Because the scan blocks, in embodiments of the present invention, are small standardized units they may be placed close to scan chain inputs and outputs of the logic units in areas which may be too small for functional logic units. The small standardized scan blocks facilitate local wiring of scan chains as illustrated in FIG. 5. These small standardized scan blocks have the added flexibility to be used in many different topologies to make local wiring connections to scan chains in the logic units of an IC. The IC designers need not be concerned with global wiring channels being congested reducing the amount of functional logic that may be wired. The IC test designers also are able to design the test connections much faster because the distributed scan blocks used in embodiments of the present invention allow placement next to scan inputs and outputs of the IC.

Figure 10:
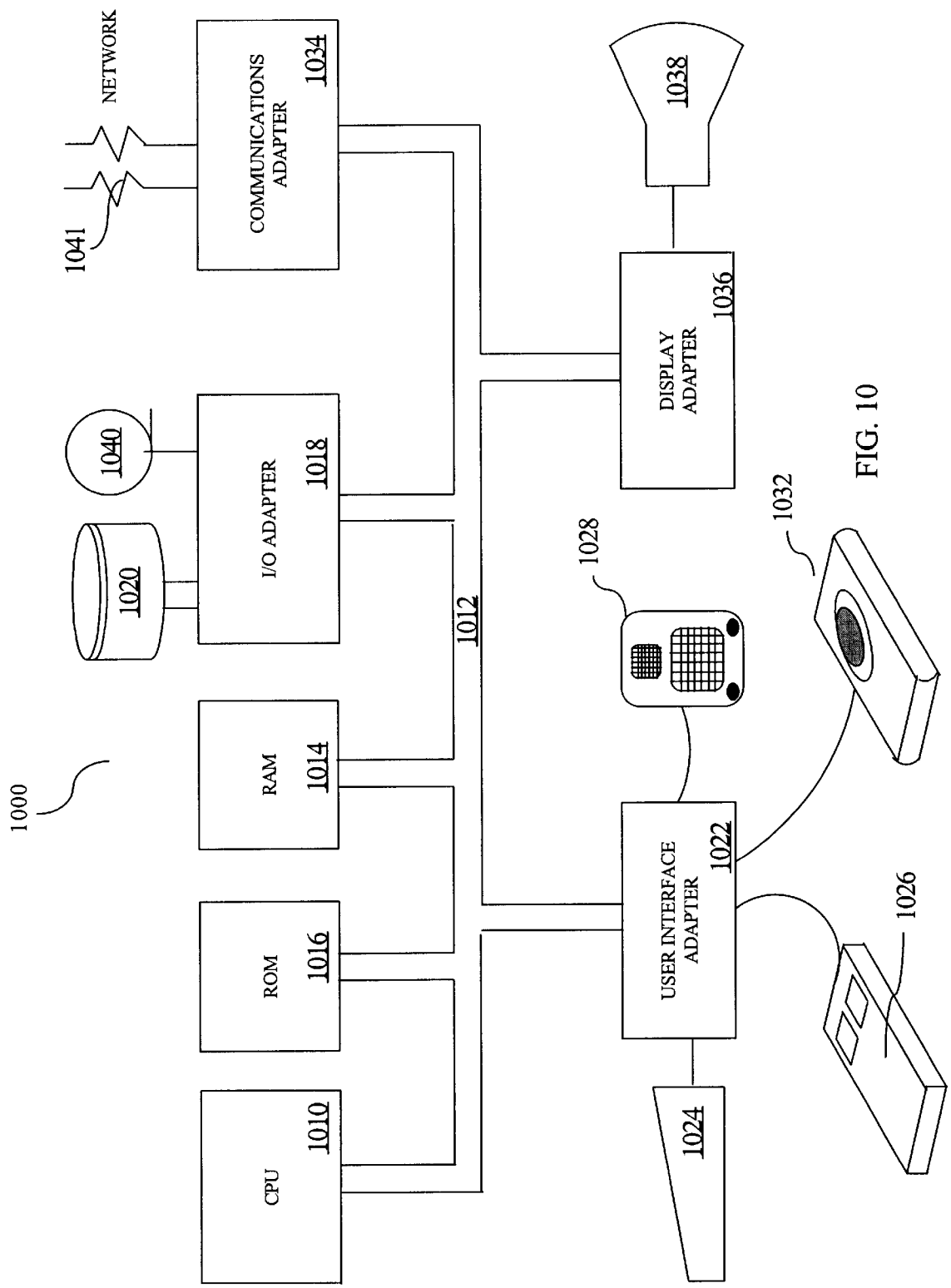
FIG. 10 is a block diagram of a data processing system which may use a processor that employs scan blocks according to embodiments of the present invention.

Referring to FIG. 10, an example is shown of a data processing system 1000 which may use embodiments of the present invention. The system has a central processing unit (CPU) 1010, which is coupled to various other components by system bus 1012. Read-Only Memory ("ROM") 1016 is coupled to the system bus 1012 and includes a basic input/output system ("BIOS") that controls certain basic functions of the data processing system 1000. Random Access Memory ("RAM") 1014, I/O adapter 1018, and communications adapter 1034 are also coupled to the system bus 1012. I/O adapter 1018 may be a small computer system interface ("SCSI") adapter that communicates with a disk storage device 1020 and tape drive 1040. A communications adapter 1034 may also interconnect bus 1012 with an outside network 1041 enabling the data processing system 1000 to communicate with other such systems. Input/Output devices are also connected to system bus 1012 via user interface adapter 1022 and display adapter 1036. Keyboard 1024, track ball 1032, mouse 1026, and speaker 1028 are all interconnected to bus 1012 via user interface adapter 1022. Display 1038 is connected to system bus 1012 via display adapter 1036. In this manner, a user is capable of inputting to the system through the keyboard 1024, trackball 1032, or mouse 1026, and receiving output from the system via speaker 1028, and display 1038.

CPU 1010 may incorporate an IC(s) that comprises scan blocks according to embodiments of the present invention. These scan blocks, designed according to embodiments of the present invention, would enable the IC(s) to be made with more useable logic and allow the design time to be reduced.

Figure 11:
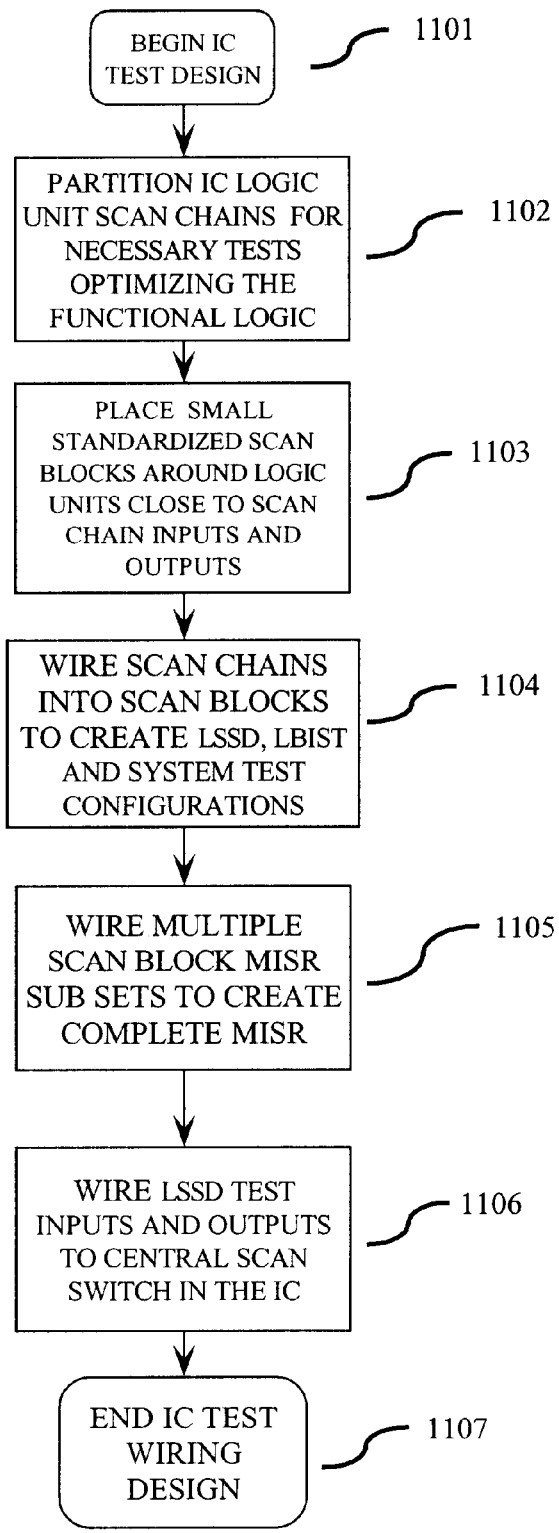
FIG. 11 is a flow diagram of method steps used in embodiments of the present invention.

FIG. 11 illustrates method steps used in embodiments of the present invention to design the LSSD test circuits used in an IC. In step 1101 the test design process is begun. In step 1102, the scan chains in the Logic Units within the IC are partitioned optimizing the functional logic in the IC. In step

1103, small standardized scan blocks are placed in areas around the Logic Units not useable for functional logic close to scan chain inputs and outputs. In step 1104, the Scan blocks are used to create the scan chains required for LSSD, LBIST and SYSTEM test modes. Trade-offs are made between wiring complexity and adding more Scan blocks. In step 1105, the MISR sub-sets of multiple scan blocks are wired to make a complete MISR. In step 1106, the inputs and outputs of the central scan switch, scan blocks and logic units are wired. In step 1107, the IC test design wiring is ended.

Although the present invention and its advantages have been described in detail, it should be understood that various changes, substitutions and alterations can be made herein without departing from the spirit and scope of the invention as defined by the appended claims.

What is claimed is:

1. A level sensitive scan design (LSSD) method of testing an IC having a plurality of logic units comprising the method steps of:
   partitioning a plurality of LSSD scan chains within each of said logic units, wherein each LSSD scan chain has a logic scan input and a logic scan output;
   positioning a plurality of scan blocks distributively in areas around said logic units, said scan blocks operable to receive and interconnect selected ones of said logic scan inputs, first selected ones of said logic scan outputs, and selected central scan switch outputs, wherein said scan blocks generate scan block outputs in response to scan block control signals;
   receiving in a central scan switch, tester inputs, second selected ones of said logic scan outputs and selected scan block outputs;
   generating in said central scan switch, central scan switch outputs, tester outputs and said scan block control signals; and
   selectively receiving in a first one of said scan blocks an output of a second one of said scan blocks.

2. The testing method of claim 1, wherein said central scan switch receives selected logic scan outputs and scan block outputs, said selected logic scan outputs and scan block outputs comprising test data results from said logic units of said IC.

3. The testing method of claim 1, wherein selected inputs to each of said scan blocks are multiplexed with internally generated scan block signals using an N-way K-fold multiplexer in response to said scan block control signals, thereby generating selected logic scan inputs to said logic units.

4. The testing method of claim 3, wherein said multiplexing concatenates selected ones of said logic unit scan chains in response to said central scan switch control signals.

5. The testing method of claim 3, wherein said central scan switch control signals set said scan blocks into multiple test modes.

6. The testing method of claim 3, wherein said central scan switch outputs comprises a joint test action group (JTAG) input and said central scan switch inputs comprise a JTAG output.

7. The testing method of claim 3, wherein each of said scan blocks comprise:
   a sub-set of a multiple input shift register (MISR), said MISR operable for generating test result signature patterns; and
   a pseudo random pattern generator (PRPG) operable to generate pattern generator outputs, said PRPG receiving an input from said central scan switch or a scan block output.

8. The testing method of claim 7, wherein selectively receiving in said first scan block said output of said second scan block forms a complete MISR from said MISR sub-sets, said complete MISR operable for generating a test signature pattern during a logic built-in self test (LBIST).

9. The testing method of claim 7, wherein said internally generated scan block signals are output signals of said PRPG pattern generator, said PRPG having parallel outputs and a serial output.

10. The testing method of claim 7, wherein selectively receiving a first output of said second scan block by said first scan block concatenates together MISR sub-sets to form an MISR and receiving a second output of said second scan block by said first scan block concatenates MISRs together in a scan chain.

11. A level sensitive scan design (LSSD) system for testing an IC having a plurality of logic units comprising:
    a plurality of LSSD scan chains within each of said logic units wherein each LSSD scan chain has a logic scan input and a logic scan output;
    a plurality of scan blocks distributively in areas around said logic units, said scan blocks operable to receive and interconnect selected ones of said logic scan inputs, first selected ones of said logic scan outputs, and selected central scan switch outputs, said scan blocks further operable to generate scan block outputs in response to scan block control signals; and
    a central scan switch, said central scan switch operable to receive tester inputs, second selected ones of said logic scan outputs and selected scan block outputs, said central scan switch further operable to generate central scan switch outputs, tester outputs and said scan block control signals,
    wherein a scan block output of a first scan block is coupled to a second scan block.

12. The system of claim 11, wherein said central scan switch receives
    selected logic scan outputs and scan block outputs, said selected logic scan outputs and scan block outputs comprising test data results from said logic units of said IC.

13. The system of claim 11, wherein selected inputs to each of said scan blocks are multiplexed with internally generated scan block test signals using an N-way K-fold multiplexer in response to said scan block control signals, thereby generating selected logic scan inputs for said logic units.

14. The system of claim 13, wherein said multiplexing concatenates selective ones of said logic unit scan chains in response to said scan block control signals.

15. The system of claim 13, wherein said scan block control signals set said scan blocks into multiple test modes.

16. The system of claim 13, wherein said central scan switch outputs comprises a joint test action group (JTAG) input and said central scan switch inputs comprise a JTAG output.

17. The system of claim 13, wherein each of said scan blocks comprise:
    a sub-set of a multiple input shift register (MISR), said MISR operable for generating test result signature patterns; and
    a pseudo random pattern generator (PRPG) operable to generate said scan block test signals, said PRPG operable to receive a central scan switch output or a scan block output.

18. The system of claim 17, wherein selectively receiving in said first scan block said output of said second scan block forms a complete MISR from said MISR sub-sets, said complete MISR operable for generating a test signature pattern during a logic built-in self test (LBIST).

19. The system of claim 17, wherein said PRPG has parallel outputs as said scan block test signals and a serial input and a serial output.

20. The system of claim 17, wherein selectively receiving a first output of said second scan block by said first scan block concatenates together MISR sub-sets to form an MISR and receiving a second output of said second scan block by said first scan block concatenates MISRs together in a scan chain.

21. A data processing system, comprising:
   a central processing unit (CPU);
   shared random access memory (RAM);
   read only memory (ROM);
   an I/O adapter; and
   a bus system coupling said CPU to said ROM, said RAM said display adapter, wherein said CPU further comprises:
      an IC, said IC having a plurality of logic units, said IC further comprising
         a plurality of LSSD scan chains within each of said logic units wherein each LSSD scan chain has a logic scan input and a logic scan output;
         a plurality of scan blocks positioned distributively in areas around said logic units, said scan blocks operable to receive and interconnect selected ones of said logic scan inputs, first selected ones of said logic scan outputs, and selected central scan switch outputs, said scan blocks further operable to generate scan block outputs in response to scan block control signals; and
         a central scan switch, said central scan switch operable to receive tester inputs, second selected of said logic scan outputs and selected scan block outputs, said central scan switch further operable to generate central scan switch outputs, tester outputs and said scan block control signals,
      wherein a scan block output of a first scan block is coupled to a second scan block.

22. The data processing system of claim 21, wherein said central scan switch receives selected logic scan outputs and scan block outputs, said selected logic scan outputs and scan block outputs comprising test data results from said logic units of said IC.

23. The data processing system of claim 21, wherein selected inputs to each of said scan blocks are multiplexed with internally generated scan block test signals using an N-way K-fold multiplexer in response to said scan block control signals, thereby generating selected logic scan inputs for said logic units.

24. The data processing system of claim 23, wherein said multiplexing concatenates selective ones of said logic unit scan chains in response to said scan block control signals.

25. The data processing system of claim 23, wherein said scan block control signals set said scan blocks into multiple test modes.

26. The data processing system of claim 23, wherein said central scan switch outputs comprises a joint test action group (JTAG) input and said central scan switch inputs comprise a JTAG output.

27. The data processing system of claim 23, wherein each of said scan blocks comprise:
   a sub-set of a multiple input shift register (MISR), said MISR operable for generating test result signature patterns; and
   a pseudo random pattern generator (PRPG) operable to generate said scan block test signals, said PRPG operable to receive a central scan switch output or a scan block output.

28. The data processing system of claim 27, wherein selectively receiving in said first scan block said output of said second scan block forms a complete MISR from said MISR sub-sets, said complete MISR operable for generating a test signature pattern during a logic built-in self test (LBIST).

29. The data processing system of claim 27, wherein said PRPG has parallel outputs as said scan block test signals and a serial input and a serial output.

30. The data processing system of claim 27, wherein selectively receiving a first output of said second scan block by said first scan block concatenates together MISR sub-sets to form an MISR and receiving a second output of said second scan block by said first scan block concatenates MISRs together in a scan chain.

* * * * *